United States Patent [19]

Eccleston et al.

[11] Patent Number: 5,402,082
[45] Date of Patent: Mar. 28, 1995

[54] VOLTAGE AND RESISTANCE SYNTHESIZER USING PULSE WIDTH MODULATION

[75] Inventors: Larry E. Eccleston, Edmonds; Daniel B. Carson, Bothell, both of Wash.

[73] Assignee: Fluke Corporation, Everett, Wash.

[21] Appl. No.: 276,067

[22] Filed: Jul. 14, 1994

[51] Int. Cl.$^6$ .............................................. H02J 5/00
[52] U.S. Cl. .................... 327/530; 323/314; 324/601
[58] Field of Search ............... 307/265, 296.1, 296.3, 307/571, 572; 323/313, 314; 324/74, 158.1, 601; 328/160; 333/213, 217; 363/41; 364/483

[56] References Cited

U.S. PATENT DOCUMENTS

| | | | |
|---|---|---|---|
| 3,947,675 | 3/1976 | Mayn | 235/184 |
| 4,375,625 | 3/1983 | Lee | 333/213 |
| 4,716,398 | 12/1987 | Eccleston et al. | 340/347 |
| 5,045,712 | 9/1991 | Baggenstoss | 307/29 |
| 5,250,774 | 10/1993 | Lee | 219/10.55 |

*Primary Examiner*—Timothy P. Callahan
*Assistant Examiner*—Jeffrey Zweizig
*Attorney, Agent, or Firm*—George T. Noe

[57] ABSTRACT

A voltage and resistance synthesizer includes a pulse width modulator (PWM) for synthesizing voltage and resistance values at a pair of terminals. A selector switch selects between a resistance synthesis mode, in which resistance values are synthesized from a single reference resistor, and a voltage synthesis mode, in which voltage values are synthesized from a single reference voltage. The pulse width modulator permits digital control words to be received which govern the synthesized value with 16 bit resolution. A low pass filter blocks the switching frequency components and provides a d.c. voltage which is the product of the duty cycle and the reference value.

6 Claims, 2 Drawing Sheets

VOLTAGE AND RESISTANCE SYNTHESIZER USING PULSE WIDTH MODULATION

BACKGROUND OF THE INVENTION

This invention relates generally to the synthesis of voltage and resistance parameters using active circuits and in particular to a voltage and resistance synthesizer capable of synthesizing a wide range of precise voltage and resistance parameters using a digitally controlled pulse width modulation technique.

The manufacturing and process industries employ a variety of electronic instrumentation such as temperature transducers, pressure transducers, and digital panel meters to measure temperature, pressure, flow rates, and other process related parameters. Maintaining such instrumentation and ensuring its accuracy and consistency over time requires calibration. Calibration of instrumentation is typically performed according to regular maintenance and calibration schedules in order to meet government regulatory requirements, to ensure uniformity of industrial processes and manufactured goods, or to ensure conformance with increasingly stringent quality control standards.

Calibrating electronic instrumentation is commonly done by measuring a wide range of known resistance and d.c. (direct current) voltages with the instrumentation and adjusting the instrumentation so that the measured values precisely match the known values. Such known values are obtained from measurement standards that are 'traceable' to NIST (National Institute of Standards and Technology). Traceability means that individual measurements are related to national standards maintained by NIST through an unbroken chain of comparisons through a series of intermediate reference standards. Calibration equipment to provide these measurements at the end of this chain are commonly known as calibrators.

Different instruments require different methods of calibration and different values of voltage and resistance. A temperature transducer, for example, converts the millivolt level signal generated by a bimetallic junction of a thermocouple into a corresponding d.c. current level in an industry-standard 4 to 20 milliamp loop. The d.c. current is then measured and converted into a corresponding temperature indication by another instrument. Calibrating a temperature transducer requires presenting a series of known input voltages which duplicate the voltage levels generated by the particular type of thermocouple, making a series of interactive adjustments of the transducer over multiple calibration points, and measuring the output current that is generated by the transducer at each calibration point. Other types of instrumentation may require a simulated resistance for calibration. For example, instruments that convert the temperature-dependent resistance provided by an RTD (resistance temperature detectors) into temperature measurements require simulated RTD resistances for calibration. Therefore, it would be desirable to provide both resistance and voltage parameters that are programmable and synthesized with sufficient accuracy and precision for purposes of instrument calibration.

Furthermore, the calibration of such instrumentation typically requires taking the instrument to be calibrated back to the instrument shop where calibration is performed using high performance calibrators, thereby removing the instrument from service during the calibration period. Separate voltage calibration and resistance calibration standards have traditionally been provided by bench-top calibration equipment whose large size and heavy weight dictate they must remain in the instrument shop. It would therefore be desirable to combine the resistance and voltage standards into one unit, reducing component count and enhancing portability.

An Impedance Synthesizer, using active circuits and employing a programmable multiplying digital-to-analog converter (DAC) for control, was disclosed in pending U.S. patent application Ser. No. 08/160,992, filed Dec. 2, 1993 and assigned to Fluke Corporation, assignee of the present invention. This circuit provides for synthesis of resistance, capacitance, and inductance values based on a single reference resistor, capacitor, or inductor. The resolution of the synthesized impedance value is governed by the number of bits of resolution available in the multiplying DAC employed in the circuit. However, this prior art synthesizer does not provide for the synthesis of d.c. voltage.

Field calibration involves the calibration of instruments "in place" rather than removing them to a central location like an instrument shop for calibration. The ability to take the calibration standard to the instrument to be calibrated would be a desirable attribute in exchange for slightly reduced performance from that of the calibrator in the instrument shop. A Linearity Control Circuit For Digital To Analog Converter is disclosed in U.S. Pat. No. 4,716,398, to Eccleston, et at., provides a high stability, synthesized d.c. voltage using a pulse width modulation (PWM) technique which obtains precision in the synthesized voltage through the precise control of the duty cycle by a digital timing method. A reference voltage is switched on and off using a pair of switches operating at a constant switching frequency but with precise control over the duty cycle. The clocked waveform is fed into a filter network which integrates it over time to obtain an average d.c. voltage. The result is a synthesized voltage that is a precisely controlled fraction of the reference voltage based on the duty cycle. Eccleston et at. teach the use of two additional switches working in tandem with the first two switches of the PWM in order to remove the effects of the switch resistance and improve the linearity of the amplifier thereby improving the accuracy of the voltage generated. For portable applications, however, it would be desirable to provide a voltage and resistance synthesizer which requires fewer components in the pulse width modulator while providing both voltage and resistance parameters of sufficient accuracy for "in place" calibration of different types of instrumentation.

SUMMARY OF THE INVENTION

In accordance with the present invention, a voltage and resistance synthesizer is provided using a pulse width modulation technique. The resistance and voltage is synthesized across a pair of terminals. A mode switch selects between the voltage synthesis mode and the resistance synthesis mode. The pulse width modulator (PWM) consists of two switches which operate in tandem, one is open while the other is closed, which serve to turn the voltage present at the input to the PWM on and off. The two switches S1 and S2 are controlled by a PWM control circuit with two outputs, one the inverse of the other, to achieve the tandem operation. The PWM control circuit has the ability to precisely control the timing relationship of the operation of the switches S1 and S2. "$T_{on}$" is the amount of time that switch S1 is closed and S2 is open. "$Tort_{off}$" is the amount of time that switch S2 is closed and S1 is open. The period T is the sum of $T_{on}$ and $T_{off}$ Finally, the duty factor (D) is ratio of $T_{on}$ divided by T. The output of the PWM is coupled to a low pass filter which functions as integrator that produces a d.c. voltage that is the average d.c. value of the switched waveform governed by the duty factor D. The PWM, working in conjunction with the low pass filter, produces a d.c. voltage is the voltage at the input to the PWM called $V_{in}$ which is multiplied by the duty factor D. D is controllable with 16 bit resolution in the present invention using an integrated circuit configured as a digital timer to function as the PWM control circuit. A digital control word, provided by a microprocessor or digital controller, sets the timing parameters of the PWM control circuit.

In voltage synthesis mode, a d.c. reference voltage $V_{ref}$ is coupled to the input of the PWM through a buffer/amplifier. The PWM, set to a predetermined switching frequency and corresponding period matched to the characteristics of the low pass filter, can then determine the output voltage of the filter $V_{filter}$ which equals $D*V_{ref}$. In this way, the PWM and low pass filter together function in combination as a voltage divider with 16 bit resolution in the preferred embodiment. In resistance synthesis mode, a test current I injected into the negative terminal causes a voltage $V_r$ to be generated across the reference resistor Rref such that the voltage V, coupled to the input of the PWM is $I*R_{ref}$. By appropriately setting the digital control parameters in the PWM control circuit to determine D, the PWM can then synthesize the output voltage $V_{synth}$, where $V_{synth}=D*I*R_{ref}$. By Ohm's law, the synthesized resistance present across the terminals is $R_{synth}=(V_{synth}/I)=D*R_{ref}$ where the synthesized resistance is controllable to the precision of D which is 16 bits in the preferred embodiment.

One object of the present invention is provide synthesized resistance and voltage parameters from one circuit.

Another object of the present invention is to provide synthesized values of resistance and voltage with high precision and stability for calibration of electronic instrumentation.

An additional object of the present invention is to provide synthesized resistance and voltage values under digital control.

Other features, attainments, and advantages will become apparent to those skilled in the an upon a reading of the following description when taken in conjunction with the accompanying drawings.

DETAILED DESCRIPTION OF THE INVENTION

Figure 1:
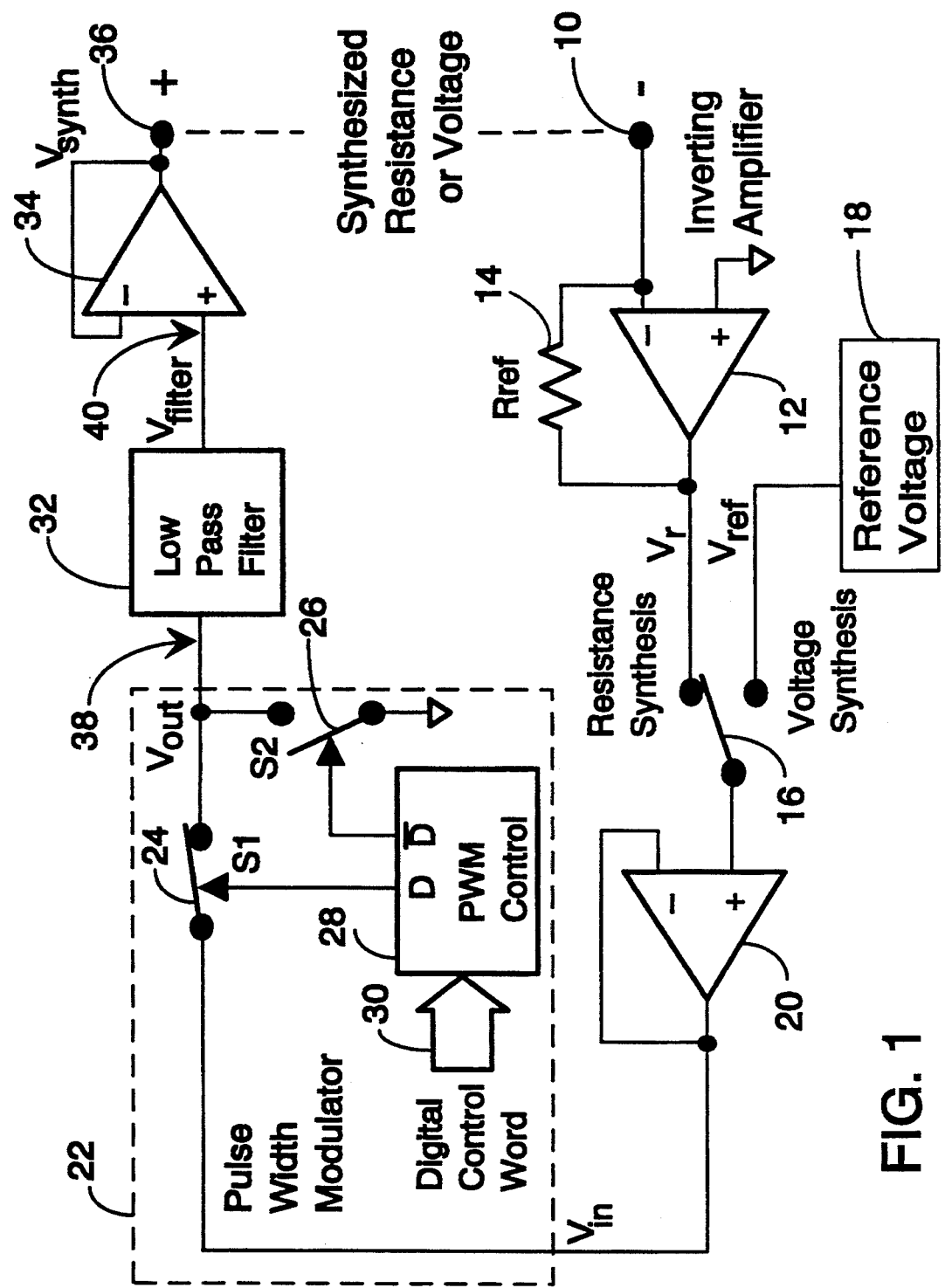
FIG. 1 is a circuit schematic of the present invention.

Referring now to FIG. 1, there is shown the circuit schematic of a proposed commercial embodiment of the present invention. Terminal 10 forms the negative terminal of the circuit in which a predetermined test current I is injected from an external instrument being calibrated for resistance. An inverting input of an amplifier 12 is coupled to terminal 10 and to a reference resistor 14 called "$R_{ref}$". Reference resistor 14 is of a type that provides a stable resistance parameter over time and over a range of ambient temperature values. A noninverting input of the amplifier 12 is connected to ground. An output of the amplifier 12 is coupled to the reference resistor 14 and to a contact of a single pole, double throw switch 16. The topology of the amplifier 12 is such that, with the noninverting input coupled to ground, the inverting input of amplifier 12 coupled to terminal 10 and one side of the resistor 14 is a virtual ground with no current flowing into the inverting input of the amplifier 12. Resistor 14 is then disposed in series between the output and the inverting input of the amplifier 12 operating as a feedback loop. The amplifier 12 thereby functions as a current-to-voltage converter in this topology and the terminal 10 is maintained at ground potential even when a test current is injected.

Resistance measuring instruments commonly perform resistance measurements by injecting the predetermined test current I into a circuit under test and measuring a voltage V that appears across the circuit as a result of the test current I. The resistance is then calculated by straightforward application of Ohm's Law where $R=V/I$. One of the functions of the present invention is to synthesize desired resistance values by synthesizing voltages which are coupled to the resistance measurement instrument responsive to the injection of the test current by the resistance measurement instrument. A predetermined current I injected into terminal 10 results in a resistor voltage $V_r$ developed at the output of the amplifier 12 such that $V_r=I*R_{ref}$. A terminal of the switch 16 is coupled to a voltage source 18 which provides a direct current (d.c.) voltage reference level labeled "$V_{ref}$". The voltage source 18 is of a type that provides a d.c. voltage parameter that is stable over time and ambient temperature. A contact of the switch 16 further connects to a noninverting input of an amplifier 20 configured as a voltage follower. The switch 16 selects between resistance synthesis mode, in which the resistor 14 and the output of amplifier 12 are coupled to the noninverting input of the amplifier 20, and voltage synthesis mode, in which the voltage source 18 is coupled to the noninverting input of the amplifier 20. An output of the amplifier 20 is coupled to an inverting input of the amplifier 20 to provide feedback and accomplish unity voltage gain. The output of the amplifier 20 forms the voltage "$V_{in}$" which equals $V_r$ when switch 16 has set for resistance synthesis mode and $V_{ref}$ when switch 16 has set for voltage synthesis mode. The output of amplifier 20 is further coupled to a single pole single throw switch 24 labeled "S1" which forms an input of a pulse width modulator 22 ("PWM") which is comprised of the switch 24, a switch 26 labeled "S2", and a pulse width modulation control circuit 28. The other side of switch 24 is coupled to the switch 26. The other side of the switch 26 is coupled to a circuit ground. A first output of the PWM control circuit 28 is coupled to a control input of the switch 24. A second output, which is inverted from the first output, is coupled to a control input of the switch 26. The switches 24 and 26 open and close responsive to switch control signals from the respective first and second outputs of the PWM control circuit 28. In the commercial embodiment, switches 24 and 26 are field effect transistors (FET's) and the PWM control circuit 28 is a commercially available integrated circuit adapted to provide digital timing functions. A digital control word is coupled via a data bus 30 to an input of the PWM control circuit 28 for the purpose of providing digital information that determines the timing parameters of the PWM 22. The junction of the switch 24 and the switch 26 forms an output of the pulse width modulator 22 with a voltage 38 labeled "$V_{out}$" which is coupled to an input of a low pass filter 32. The low pass filter 32 has a cutoff frequency and a sufficient number of poles to remove the switching frequency of the PWM 22 and develops a d.c. voltage 40 labeled "$V_{filter}$". The low pass filter 32 functions as an integrator which stores electrical charge from the voltage at its input over time and the voltage thus developed at its output is integrated over the period of the voltage waveform. Because $V_{out}$ is a rectangular pulse, this integration function reduces to a simple average voltage which is a direct function of the duty factor D of the PWM 22. Low pass filter 32, designed to remove the switching frequency components of the PWM 22, has a cutoff frequency and number of poles chosen in such a manner as to produce a sufficiently pure d.c. voltage at its output, called $V_{filter}$. The purity of the voltage $V_{out}$, a measure of how completely the switching frequency components of the PWM 22 are blocked, is traded off against complexity and cost of the components that comprise the low pass filter 32. In the preferred embodiment, the switching period T of PWM 22 is kept constant while $T_{on}$ is varied to adjust D. Alternatively, T may be varied while $T_{on}$ is kept constant to achieve the same effect. An output of the low pass filter 32 is coupled to a noninverting input of an amplifier 34 configured as a voltage follower. An output of the amplifier 34 is coupled to an inverting input of the amplifier 34 to achieve unity voltage gain. The output of the voltage follower 34 is further coupled to an output terminal 36 which forms the positive terminal in which the output voltage $V_{synth}$ is developed. Because the amplifier 34 has unity voltage gain, $V_{synth}$ equals $V_{filter}$. Thus, $V_{synth}$ is developed between the terminals 10 and 36 responsive to a test current I injected into terminal 10. Maintaining terminal 10 at ground potential allows the invention to remain a two-terminal device to the instrument being calibrated rather than maintaining a separate reference ground. The synthesized resistance $R_{synth}$ between the terminals 10 and 36 as measured by an external resistance measuring instrument coupled to terminals 10 and 36 is $R_{synth}=V_{synth}/I=(D*I*R_{ref})/I=D*R_{ref}$.

Figure 2A:
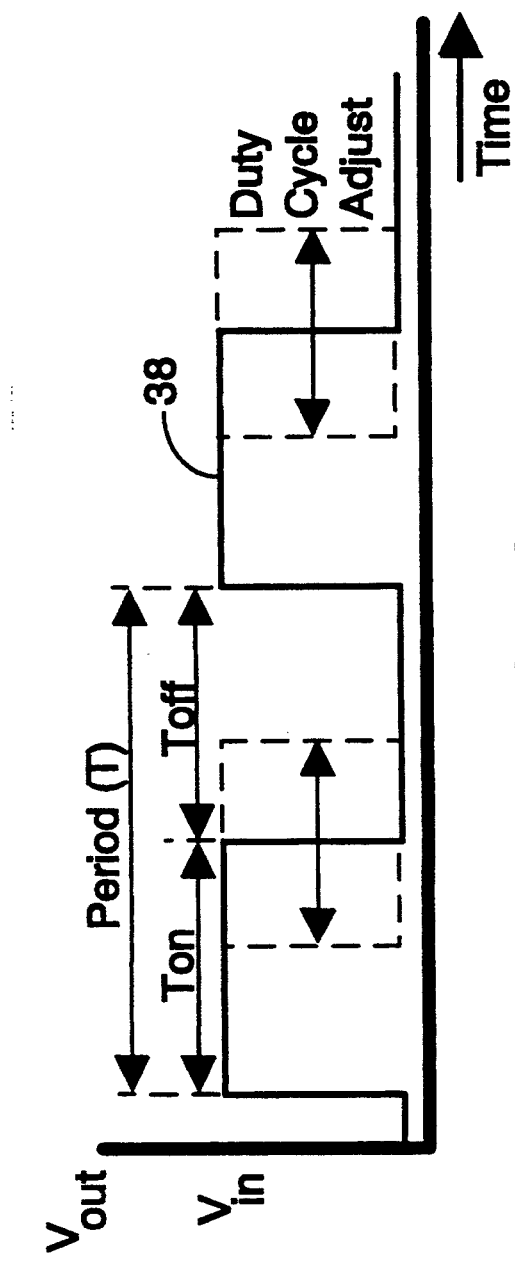
FIG. 2A and FIG. 2B are waveform diagrams that illustrate the timing relationships of pulse width modulation and the use of a low pass filter on the pulse width modulated signal.

Referring now to FIG. 2A, a representative voltage waveform developed at the output of the PWM 22 is shown in a graph of $V_{out}$ versus time. $V_{out}$ resembles a positive square pulse with a repetition period T and pulse width $T_{on}$. During the $T_{on}$ phase, switch 24 is closed and switch 26 is open responsive to the switch control signals of the PWM control circuit 28. During the $T_{off}$ phase, switch 24 is open and switch 26 is closed responsive to the switch control signals of the PWM control circuit 28. In the commercial embodiment, repetition period T is maintained at a constant 1 millisecond, corresponding to a switching frequency of 1 kilohertz. Duty factor D is the ratio of pulse width $T_{on}$ to period T. Pulse width $T_{on}$ can be adjusted between 0 seconds to 1 millisecond, meaning the duty factor D can be varied from 0% to 100%. PWM control circuit 28 contains digital timer circuits which determine the time intervals T and $T_{on}$ that are determined by values loaded from the digital data bus 30. In the commercial embodiment, PWM control circuit 28 is a digital integrated circuit which provides 16 bit resolution in determining T and $T_{on}$.

Figure 2B:
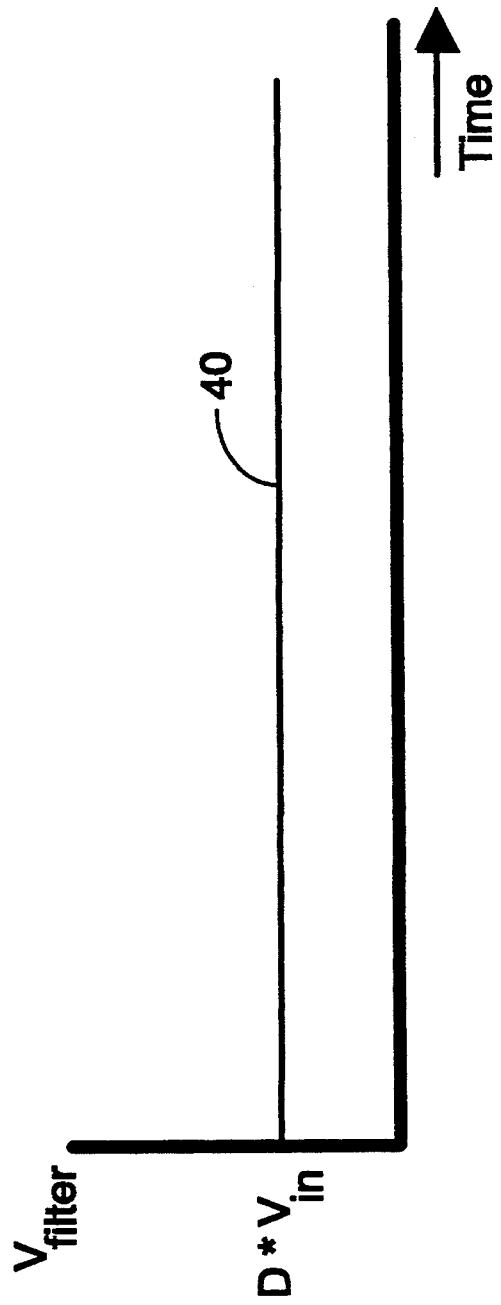

FIG. 2B illustrates the voltage 40, called $V_{filter}$, which is present at the output of the low pass filter 32. The horizontal time axis and vertical voltage axis are of the same scale as the graph of FIG. 2A for comparison purposes. Low pass filter 32 is designed to filter out the switching frequency components present in $V_{out}$ as a result of the operation of the PWM 22. In doing so, low pass filter 32 acts as a voltage integrator, developing a d.c. voltage which is the average value of the voltage $V_{out}$ over the period T. The value of the output voltage $V_{filter}$ corresponds to the duty factor D multiplied by the input voltage $V_{in}$. Thus, the graph illustrates that $V_{filter}$ is a d.c. voltage of level $D*V_{in}$ where D may be any value between 0 and 1 depending on the choice of digital control words to control the PWM control circuit 28.

Referring back to FIG. 1, there is shown the circuit operating in resistance synthesis mode where the output voltage $V_{synth}$ appears at the terminal 36 as a result of the test current I injected in to the terminal 10. $V_{synth}=V_{filter}=D*V_r$ where $V_r=I*R_{ref}$. The synthesized resistance parameter $R_{synth}$, is calculated by the formula $V_{synth}/I=D*R_{ref}$. Because D is controllable by digital control words sent over the digital data bus 30, synthesized resistance values may be selected and provided to an instrument to be calibrated for resistance measurements which is coupled to the terminals 10 and 36. Alternatively, the circuit may operate in voltage synthesis mode, in which the output voltage appearing at terminal 36 is $V_{synth}=V_{filter}=D*V_{ref}$ for calibration of instruments which measure voltage.

It will be obvious to those having ordinary skill in the art that many changes may be made in the details of the above described preferred embodiments of the invention without departing from the spirit of the invention in its broader aspects. For example, the amplifiers 20 and 34 may be reconfigured for other selected levels of voltage gain in order to achieve scaling of the desired synthesized resistance or voltage values. The period T of the pulse width modulator may be varied while the on time $T_{on}$ is kept constant. Therefore, the scope of the present invention should be determined by the following claims.

What I claim as my invention is:

1. A voltage and resistance synthesizer comprising:
   (a) a reference resistor coupled across an inverting amplifier for receiving a test current from an instrument to be calibrated to provide a first voltage;
   (b) a reference voltage source to provide a second voltage;
   (c) a switch coupled to said reference resistor and said reference voltage source for selecting one of said first and second voltage;
   (d) a PWM for modulating said selected one of said first and second voltages in accordance with a control signal having a controllable duty factor;, and
   (e) filter means coupled to said PWM to produce a d.c. voltage that is proportional to said duty factor.

2. A voltage and resistance synthesizer of claim 1 wherein said duty factor is digitally programmable.

3. A voltage and resistance synthesizer of claim 1 wherein said filter means comprises a low pass filter circuit.

4. A voltage and resistance synthesizer of claim 1 further comprising output means coupled to said filter means for coupling said d.c. voltage to an instrument to be calibrated.

5. A voltage and resistance synthesizer of claim 1 wherein said PWM further comprises:

(a) a PWM input coupled to said switch means;

(b) a PWM output coupled to said filter means;

(c) a first PWM switch means disposed in series between said PWM input and said PWM output wherein said first PWM switch means actuates responsive to said control signal coupled to a control input;

(d) a second PWM switch means disposed in shunt between said PWM output and a circuit ground wherein said second PWM switch means actuates responsive to said control signal coupled to a control input; and (e) a PWM control circuit coupled to said first PWM switch means and said second PWM switch means, and said PWM control circuit further coupled to a digital data bus wherein said PWM control circuit provides control signals to said first and second PWM switches responsive to digital control words.

6. A voltage and resistance synthesizer of claim 5 wherein said PWM control circuit further comprises a digital timer integrated circuit.

* * * * *